Aug. 2, 1966 R. L. BATDORF ETAL 3,264,149

METHOD OF MAKING SEMICONDUCTOR DEVICES

Filed Dec. 19, 1963

INVENTORS R. L. BATDORF
C. A. LEE
W. WIEGMANN

BY David P. Kelley

ATTORNEY 3,264,149
Patented August 2, 1966

3,264,149

METHOD OF MAKING SEMICONDUCTOR DEVICES

Robert L. Batdorf, Berkeley Heights, Charles A. Lee, New Providence, and William Wiegmann, Middlesex, N.J., assignors to Bell Telephone Laboratories, Incorporated, New York, N.Y., a corporation of New York Filed Dec. 19, 1963, Ser. No. 331,881
4 Claims. (Cl. 148—186)

Figure 1A:

This invention relates to semiconductor junction diode devices, and, more particularly, to such devices which exhibit avalanche breakdown, and to a method of making such devices.

In a p–n junction diode, for example, which is characterized by avalanche breakdown behavior, when a sufficiently large reverse bias is applied, the device breaks down and conducts current in the reverse direction. Once breakdown occurs, the current through the device increases greatly, or exhibits a very steep rise, with little or no increase in reverse-bias voltage. This characteristic is known as avalanche breakdown.

Diodes exhibiting avalanche breakdown are useful in a variety of applications, such as, for example, voltage regulations, photodetection, particle detection, and negative-resistance diodes. A voltage-regulator diode makes use of the exceptionally hard reverse current-voltage characteristic typical of an ideal avalanche breakdown. In photodetection and particle detection, the high and uniform multiplication typical of the ideal avalanche breakdown device is utilized. A negative-resistance diode of the type shown n U.S. Patents 2,899,646 and 2,899,652 of W. T. Read, Jr., also makes use of the high value and uniformity of multiplication of the ideal avalanche breakdown to produce, among other things, very high frequency oscillation.

Heretofore, the realization of practical devices based upon these characteristics have been, to a large extent, frustrated by the low values of multiplication obtainable, local nonuniformity of the multiplication, and the presence of microplasmas. Prior to the present invention, practical values of multiplication which have been obtainable are much less than the theoretically possible values. Large multiplications are obtainable in the neighborhood of microplasmas; however, these multiplications are not usable because of the very high noise and unstable operating characteristics of the microplasmas.

These microplasmas are caused faults in the crystal of the junction device, which may take the form of lattice irregularities, atomic misarrays within the material, stacking faults, and by precipitates of impurity atoms at the faults. In the manufacture of juncton diodes exhibiting avalanche breakdown, it has been thus far extremely difficult to predict the number or degree of such faults, with the net result that in a single production run, the breakdown characteristics of the devices vary widely.

It is an object, therefore, of the present invention, to produce avalanche breakdown, semiconductor junction diode devices having high multiplications, uniform multiplication, and avalanching characteristics which are reproducible within a very narrow tolerance range.

It is another object of the present invention to produce substantially microplasma-free high uniform multiplication avalanche breakdown devices utilizing a method which is readily adaptable to quantity production by virtue of its relative simplicity.

These and other objects of the present invention are achieved in an illustrative embodiment thereof in which a silicon n-p-i-p diode is fabricated by a process, the principal features of which are as follows. The silicon sample is lapped to size and cleaned by ultrasonically shaking in cleaning solutions, and etched in a copper displacement plating bath for approximately five minutes. The sample is then agitated in a nitric acid bath until the copper plating is removed, then rinsed in de-ionized water. The sample is then etched in a hydrofluoric acid-nitric acid solution for twenty-five minutes and rinsed in de-ionized water and agitated ultrasonically.

The sample is then placed in a diffusion bucket and diffused at the appropriate vapor pressure for the desired impurity which may be, for example, gallium, arsenic, or phosphorus. In the present embodiment, gallium vapor is diffused at a pressure of approximately $10^{-1}$ to $10^{-2}$ millimeters of mercury, for approximately two hours. The sample is then cooled to room temperature and masked with a plurality of dots of black wax, after which it is etched in concentrated nitric acid and hydrofluoric acid for approximately six minutes, producing mesas approximately twelve microns high on the surface of the sample. The sample is then cleaned.

After the sample is cleaned, it is again placed in a diffusion bucket and diffused in vacuum with a suitable type of impurity, which, in the present embodiment, is arsenic derived from arsenic oxide, for from fifteen to sixty minutes at approximately 1250° C.

The sample is then remasked and etched to produce a guard ring structure, after which it is cleaned, mounted and contacts affixed thereto.

From the foregoing, it can be seen that the junction diode is fabricated by a series of steps that are readily usable in production, and, by virtue of these steps, uniform high multiplication free of microplasma effects is obtained.

These and other features of the present invention will be more apparent from the following detailed description taken in conjunction with the following drawings, in which:

FIGS. 1*a* through 1*e* depict the various steps in the process.

In the following description of the process, particular attention is paid to the fabrication of a negative resistance diode of the type disclosed in the aforementioned W. T. Read, Jr. patents. It is to be understood, however, that the process is readily adaptable to the fabrication of other types of diodes as well, wherever high uniform multiplication and absence of microplasmas are desired.

A silicon sample 11 is sliced to a suitable thickness and then lapped with abrasive to suitable thickness. The sample is then cleaned by being ultrasonically shaken in three successive changes of trichloroethylene. This means ultrasonically shaking the sample in trichloroethylene, discarding the trichloroethylene, ultrasonically shaking in the trichloroethylene again, et cetera, then three successive ultrasonic shakes in acetone and followed by three successive ultrasonic shakes in methyl alcohol. The sample is then dried on filter paper and appears as in FIG. 1*a*.

Figure 1B:
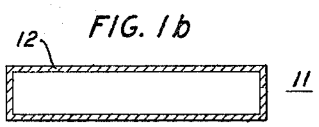

Next the sample is subjected to a five minute boil in a 9:1:1 solution of water, 30 percent hydrogen peroxide, and ammonium hydroxide. The sample is then transferred to a copper displacement plating bath consisting of .1 N copper sulphate ($CuSO_4$) and .1 N hydrofluoric acid for five minutes with slow agitation. This step etches the silicon by displacing it with copper and surrounds any etchant insoluble abrasive particles with copper. The result is depicted in FIG. 1*b*, which shows a copper layer 12 on sample 11.

The plating solution is then poured off and replaced with concentrated nitric acid. The sample is swirled in the concentrated nitric acid until the bright copper plating is gone which takes only a few seconds. This solution is poured off and the sample is transferred to a quartz beaker containing boiling concentrated nitric acid for a period of from two to five minutes. The nitric acid solution is poured off and the sample is again boiled for two to five minutes in a fresh solution of concentrated nitric acid. The sample is then rinsed in running de-ionized water. The sample is then etched in a solution consisting of twenty parts of concentrated nitric acid and one part hydrofluoric acid. It is etched for twenty-five minutes in a polyethylene beaker which is suspended in a water bath on a mechanical swirler. Following etching, the sample is then rinsed in running de-ionized water for ten minutes. This step is then followed by a five minute ultrasonic shake in concentrated ammonium hydroxide, after which the sample is given a five minute rinse in running de-ionized water and followed by a ten minute rinse in recirculated de-ionized water while being shaken ultrasonically. The sample is then blotted dry on filter paper.

After drying, the sample is loaded into a tantalum diffusion bucket with tantalum tweezers. (All transfers to this point have been made by dumping the sample from one container to another without handling with tweezers.) The sample is then diffused in an appropriate vapor pressure of the desired impurities, which may be gallium, arsenic, or phosphorus, for example. In the Read diode case, this consists of a diffusion at a pressure of approximately $10^{-1}$ to $10^{-2}$ millimeters of mercury of gallium vapor to establish a p-type layer on the $\pi$-type wafer 11. This vapor pressure is established in the bucket by heating one of the elements in the vacuum station to a suitable temperature and allowing the gallium vapors to pass through the gallium bucket. A diffusion time of two hours is used since this is sufficiently long to establish the equilibrium impurity distribution encountered with this type boundary condition.

Figure 1C:
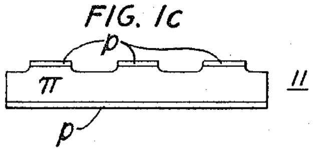

After cooling, the sample is removed and dots of black wax are placed on the surface to mask it prior to mesa etching. The sample is then etched in 40:1 concentrated nitric acid and concentrated hydrofluoric acid for six minutes. This etches mesas approximately twelve microns high, as depicted in FIG. 1*c*.

The process, as thus far described, results in a substantially microplasma-free device. With proper doping and diffusants, diodes fabricated in accordance with the foregoing process are ideally suited for use as voltage regulators and particle or photodetectors.

The remaining steps of the process are directed toward the fabrication of negative-resistance diodes, such as, for example, the aforementioned Read diode.

Figure 1D:
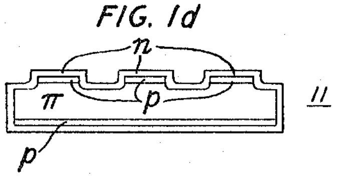

Following the mesa etch, the sample is again rinsed in running de-ionized water for five minutes. This is followed with a rinse in trichlorethylene to remove the bulk of the black wax. The sample is then given several cleansings in trichlorethylene in an ultrasonic shaker for two minutes each. The sample is then dried on filter papers to remove the trichlorethylene and transferred to a quartz beaker containing a boiling mixture of 9:1:1 water, hydrogen peroxide, and ammonium hydroxide for three minutes, and then is rinsed in running de-ionized water for five minutes. The sample is then placed in concentrated hydrofluoric acid for one minute and again rinsed in running de-ionized water for five minutes, after which it is given an ultrasonic shake in 28 percent ammonium hydroxide for five minutes. This is then followed by a five minute rinse in running de-ionized water after which the sample is given a ten to fifteen minute rinse in recirculated filtered de-ionized water with simultaneous ultrasonic shaking. The sample is then dried on filter paper and reloaded into the diffusion system with tantalum tweezers. The sample is then diffused in the vacuum in a suitable vapor of arsenic derived from an arsenic oxide source for from fifteen to sixty minutes at approximately 1250° C. to produce an n-type layer, after which the sample is cooled and removed from the diffusion bucket. At this stage, the sample is as depicted in FIG. 1*d*. The sample is then remasked with black wax and re-etched in an etch containing nitric, acetic, and hydrofluoric acids for thirty seconds. This etch is well-known in the art and is commonly designated CP–4. This produces the guard ring structure depicted in FIG. 1*e* after the removal of black wax.

Figure 1E:
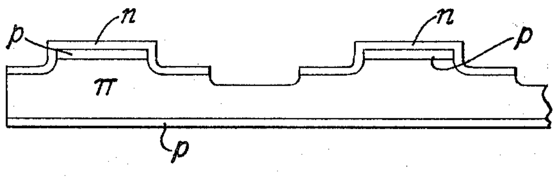

The final structure, as depicted in FIG. 1*e*, is not only free from gross microplasmas but also exhibits a multiplication which may be uniform within 1 to 2 percent at multiplication levels of 1000 which is much better than can be obtained on a single diffused layer or on alloy junctions where variations of crystal doping prevents such uniformity, i.e., a greater degree of uniformity is a result of the double diffusion.

The foregoing steps have produced a semiconductor junction which is free of microplasma defects and exhibits uniform multiplication. After cutting into individual diodes contacts to this material must be made either at room temperature or at elevated temperatures providing suitable steps are made in cleaning the surface to prevent the re-establishment of impurity aggregates in the sample which can come as a result of the heating step in, for example, an alloy process.

From the foregoing, it can readily be seen that the process for fabricating microplasma-free, high uniform multiplication avalanche breakdown devices is relatively simple, and readily adaptable to quantity production of such devices. While particular materials have been discussed in describing the process, other materials may be used by workers in the art without departure from the spirit and scope of the present invention.

What is claimed is:

1. The method of making microplasma-free junctions in semiconductor material comprising the steps of
- etching and cleaning a sample of the material,
- copper plating the sample by copper displacement plating,
- agitating and boiling the sample in nitric acid to remove the copper plating and impurities,
- diffusing the diffusant metal into the sample in a vacuum chamber while maintaining the appropriate vapor pressure for the diffusant,
- cooling the sample to room temperature,
- masking the sample and etching to form mesas on the sample, and
- cleaning the sample.

2. The method as claimed in claim 1 wherein the semiconductor material is silicon and the diffusant is gallium, diffused at a vapor pressure of $10^{-1}$ to $10^{-2}$ millimeters of mercury.

3. The method of making microplasma-free junctions in a semiconductor material comprising the steps of
- etching and cleaning a silicon wafer,
- copper plating the wafer by copper displacement plating,
- agitating and boiling the wafer in nitric acid to remove the copper plating and impurities,
- diffusing a p-type diffusant into the wafer while maintaining the appropriate vapor pressure for the diffusant,
- cooling the wafer to room temperature, masking the wafer and etching to form mesas on the sample, cleaning the wafer by rinsing in de-ionized water, ultrasonically shaking in trichlorethylene, boiling in a solution of water, hydrogen peroxide and ammonium hydroxide, etching the wafer in hydrochloric acid and then cleaning it, diffusing an n-type diffusant onto the wafer, masking and etching the wafer to produce a guard ring structure, and cleaning the wafer.

4. The method as claimed in claim 3 in which the p-type diffusant is gallium diffused at a vapor pressure of $10^{-1}$ to $10^{-2}$ millimeters of mercury and the n-type diffusant is arsenic diffused at a temperature of approximately 1250° C.

References Cited by the Examiner

UNITED STATES PATENTS

| | | | |
|---|---|---|---|
| 2,899,646 | 8/1959 | Read | 331—96 |
| 2,899,652 | 8/1959 | Read | 331—80 |
| 3,154,450 | 10/1964 | Little | 148—187 |
| 3,184,823 | 5/1965 | Hoeckleman | 148—189 |

HYLAND BIZOT, *Primary Examiner.*